(12) United States Patent
Manna et al.

(10) Patent No.: US 10,529,585 B2
(45) Date of Patent: Jan. 7, 2020

(54) DRY STRIPPING OF BORON CARBIDE HARDMASK

(71) Applicant: Applied Materials, Inc., Santa Clara, CA (US)

(72) Inventors: Pramit Manna, Sunnyvale, CA (US); Shishi Jiang, Santa Clara, CA (US); Abhijit Basu Mallick, Fremont, CA (US); Kurtis Leschkies, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/995,698

(22) Filed: Jun. 1, 2018

(65) Prior Publication Data

US 2018/0350621 A1    Dec. 6, 2018

Related U.S. Application Data

(60) Provisional application No. 62/648,073, filed on Mar. 26, 2018, provisional application No. 62/514,554, filed on Jun. 2, 2017.

(51) Int. Cl.
*H01L 21/311* (2006.01)
*H01L 21/02* (2006.01)
(Continued)

(52) U.S. Cl.
CPC ........ *H01L 21/31122* (2013.01); *C23C 16/32* (2013.01); *C23C 16/38* (2013.01);
(Continued)

(58) Field of Classification Search
None
See application file for complete search history.

(56) References Cited

U.S. PATENT DOCUMENTS

| 4,524,587 A | 6/1985 | Kantor |
| 5,050,540 A | 9/1991 | Lindberg |

(Continued)

FOREIGN PATENT DOCUMENTS

| CN | 101871043 A | 10/2010 |
| CN | 104047676 A | 9/2014 |

(Continued)

OTHER PUBLICATIONS

International Search Report and Written Opinion for PCT/US2018/021715 dated Jun. 22, 2018.

(Continued)

*Primary Examiner* — Jiong-Ping Lu
(74) *Attorney, Agent, or Firm* — Patterson + Sheridan LLP

(57) ABSTRACT

Embodiments of the disclosure generally relate to a method for dry stripping a boron carbide layer deposited on a semiconductor substrate. In one embodiment, the method includes loading the substrate with the boron carbide layer into a pressure vessel, exposing the substrate to a processing gas comprising an oxidizer at a pressure between about 500 Torr and 60 bar, heating the pressure vessel to a temperature greater than a condensation point of the processing gas and removing one or more products of a reaction between the processing gas and the boron carbide layer from the pressure vessel.

20 Claims, 4 Drawing Sheets

(51) Int. Cl.
  *C23C 16/38* (2006.01)
  *C23C 16/32* (2006.01)
  *H01L 21/67* (2006.01)
  *H01L 21/677* (2006.01)

(52) U.S. Cl.
  CPC .... *H01L 21/0206* (2013.01); *H01L 21/02046* (2013.01); *H01L 21/31116* (2013.01); *H01L 21/31144* (2013.01); *H01L 21/67017* (2013.01); *H01L 21/6719* (2013.01); *H01L 21/67103* (2013.01); *H01L 21/67109* (2013.01); *H01L 21/67248* (2013.01); *H01L 21/67754* (2013.01)

(56) References Cited

U.S. PATENT DOCUMENTS

| | | |
|---|---|---|
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |
| 5,590,695 A | 1/1997 | Siegele et al. |
| 5,620,524 A | 4/1997 | Fan et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Liang et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |

(56) References Cited

U.S. PATENT DOCUMENTS

| | | |
|---|---|---|
| 2014/0264237 A1 | 9/2014 | Chen et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1* | 3/2016 | Lee .................. G03F 7/427 134/1.2 |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0261480 A1 | 9/2018 | Liang et al. |

FOREIGN PATENT DOCUMENTS

| | | |
|---|---|---|
| CN | 104089491 A | 10/2014 |
| JP | H07048489 B2 | 5/1995 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2010-205854 A | 9/2010 |
| JP | 2012-503883 A | 2/2012 |
| JP | 2012-204656 A | 10/2012 |
| JP | 2013516788 A | 5/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/037539 dated Oct. 5, 2018.
International Search Report and Written Opinion for PCT/US2018/038822 dated Oct. 26, 2018.
International Search Report and Written Opinion from PCT/US2019/012161 dated Apr. 30, 2019.
International Search Report and Written Opinion for PCT/US2019/014759 dated May 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
Shimoyama, Takehiro et al., "Porous Aluminum for Heat Exchanger", Hitachi Chemical Technical Report No. 59, Hitachi Chemical, pp. 19-20.
International Search Report and Written Opinion for PCT/US2018/043160 dated Jan. 31, 2019.
International Search Report and Written Opinion for PCT/US2018/059643 dated Feb. 26, 2019.
Office Action for Japanese Application No. 2018-546484 dated Oct. 8, 2019.
International Search Report and Written Opinion for International Application No. PCT/US2019/040195 dated Oct. 25, 2019.
International Search Report and Written Opinion for International Application No. PCT/US2019/029602 dated Aug. 14, 2019.
Taiwan Office Action dated Jun. 11, 2019 for Application No. 107138905.

* cited by examiner

DRY STRIPPING OF BORON CARBIDE HARDMASK

CROSS-REFERENCE TO RELATED APPLICATIONS

This application claims benefit of U.S. provisional patent application Ser. No. 62/541,554, filed Jun. 2, 2017, and U.S. provisional patent application Ser. No. 62/648,073, filed Mar. 26, 2018, both of which are herein incorporated by reference.

BACKGROUND

Field

Embodiments of the disclosure generally relate to fabrication of integrated circuits and particularly to a method of dry stripping a boron carbide layer on a semiconductor substrate.

Description of the Related Art

Formation of a semiconductor device, such as memory devices, logic devices, microprocessors, etc., involves formation of a hardmask. A hardmask is formed as a blanket layer on an underlying substrate to be etched. A patterned layer of photo-resist is formed over the hardmask before the hardmask is etched using the photo-resist layer as a pattern. After patterning the hardmask, the photo-resist layer is removed such that the hardmask remains the sole pattern for etching the underlying substrate. While a hardmask is a separate layer formed on the underlying substrate, etched, and then removed from the substrate, improved resistance to the process of etching as well as reduced costs make hardmasks desirable. Films of boron-doped carbon and boron carbide are commonly known to produce high-quality hardmask due to superior patterning performance.

However, boron carbide layers are difficult to remove or strip from the underlying substrate after etching since boron carbide layers cannot be ashed using a conventional oxygen plasma. Boron carbide layers can be dry stripped using fluorine or chlorine along with oxygen; however, fluorine and chlorine are corrosive to dielectric materials such as silicon oxide, silicon nitride, and silicon oxynitride commonly found on semiconductor substrates. A wet-etch solution, if used, can also damage exposed metal surfaces or embedded metals commonly found on semiconductor substrates.

Thus, there is need for an improved method of dry stripping boron carbide layers from semiconductor substrates.

SUMMARY

Embodiments of the disclosure generally relate to a method for dry stripping a boron carbide layer deposited on a semiconductor substrate. In one embodiment, the method includes loading the substrate having the boron carbide layer into a pressure vessel, exposing the substrate to a processing gas comprising an oxidizer at a pressure between about 500 Torr and about 60 bar, heating the pressure vessel to a temperature greater than a condensation point of the processing gas, and removing one or more products of a reaction between the processing gas and the boron carbide layer from the pressure vessel.

In another embodiment of the disclosure, the method includes loading one or more substrates including at least a first substrate having a boron carbide layer into a pressure vessel, exposing the first substrate to a processing gas comprising an oxidizer at a pressure between about 500 Torr and 60 bar, heating the pressure vessel to a temperature greater than a condensation point of the processing gas, and removing one or more products of a reaction between the processing gas and the boron carbide layer from the pressure vessel.

In yet another embodiment, the method includes loading one or more substrates including at least a first substrate into a pressure vessel, the first substrate having a boron carbide layer deposited thereon, exposing the first substrate to a processing gas comprising steam at a pressure between about 500 Torr and 60 bar, heating the pressure vessel to a temperature greater than a condensation point of the processing gas, removing one or more products of a reaction between the processing gas and the boron carbide layer from the pressure vessel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to a method for dry stripping a boron carbide layer deposited on a semiconductor substrate. An oxidizer, such as but not limited to, steam under high pressure is used to oxidize the boron carbide layer into boron trioxide. The boron trioxide then reacts with excess steam to produce gaseous products such as boric acid and metaboric acid. The conversion of a solid boron carbide layer on a semiconductor substrate into gaseous products and the subsequent removal of the gaseous products provide an effective way to dry strip the boron carbide layer. A batch processing chamber, such as but not limited to a pressure vessel 100 shown in FIG. 1 and described herein, is utilized to perform the method of dry stripping the boron carbide layer on a plurality of substrates. The method described herein can be equally applied to a single substrate disposed in a single substrate chamber, such as the exemplary single substrate processing chamber 300 shown in FIG. 3, or other suitable single substrate processing chambers.

Figure 1:
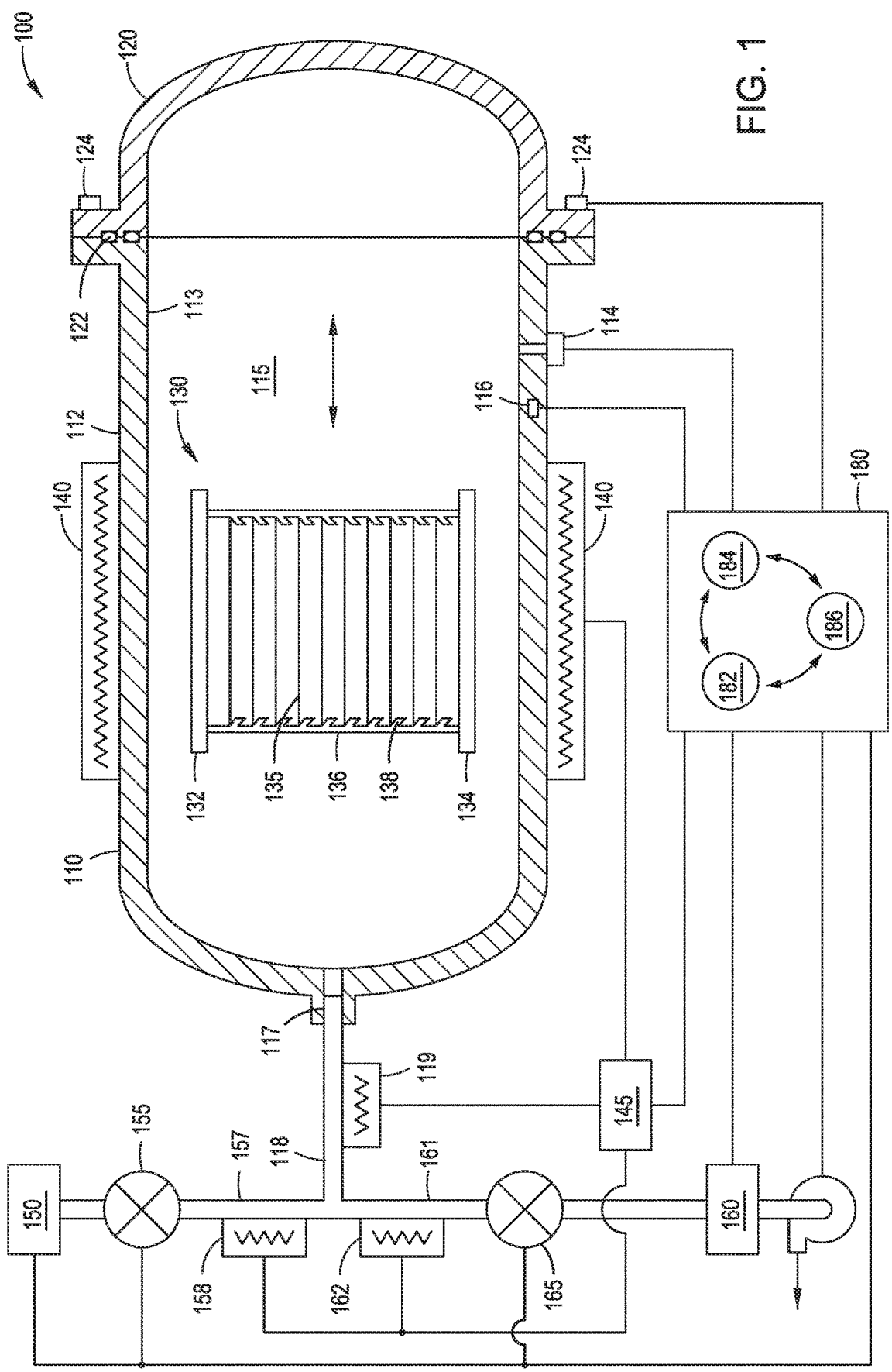
FIG. 1 is a simplified front cross-sectional view of a pressure vessel for dry stripping boron carbide layers from a plurality of substrates loaded on a cassette.

FIG. 1 is a simplified front cross-sectional view of a batch processing pressure vessel 100 for dry stripping boron carbide layers. The pressure vessel 100 has a body 110 with an outer surface 112 and an inner surface 113 that encloses a processing region 115. In some embodiments such as in FIG. 1, the body 110 has an annular cross section, though in other embodiments the cross-section of the body 110 may be rectangular or any closed shape. The outer surface 112 of the body 110 may be made from a corrosion resistant steel (CRS), such as but not limited to stainless steel. The inner surface 113 of the body 110 may be made from nickel-based steel alloys that exhibit high resistance to corrosion, such as but not limited to HASTELLOY®.

The pressure vessel 100 has a door 120 configured to sealably enclose the processing region 115 within the body 110 such that the processing region 115 can be accessed when the door 120 is open. A seal 122 is utilized to seal the door 120 to the body 110 in order to seal the processing region 115 for processing. The seal 122 may be made from a polymer, such as but not limited to a perflouroelastomer. A cooling channel 124 is disposed on the door 120 adjacent to the seals 122 in order to maintain the seals 122 below the maximum safe-operating temperature of the seals 122 during processing. A cooling agent, such as but not limited to an inert, dielectric, and/or high-performance heat transfer fluid, may be circulated within the cooling channel 124 to maintain the seals 122 at a temperature between about 250 degrees Celsius and about 275 degrees Celsius, while the temperature in the processing region 115 is about 800 degrees Celsius. The flow of the cooling agent within the cooling channel 124 is controlled by a controller 180 through feedback received from a temperature sensor 116 or a flow sensor (not shown).

The pressure vessel 100 has a port 117 through the body 110. The port 117 has a pipe 118 therethrough, which is coupled to a heater 119. One end of the pipe 118 is connected to the processing region 115. The other end of the pipe 118 bifurcates into an inlet conduit 157 and an outlet conduit 161. The inlet conduit 157 is fluidly connected to a gas panel 150 via an isolation valve 155. The inlet conduit 157 is coupled to a heater 158. The outlet conduit 161 is fluidly connected to a condenser 160 via an isolation valve 165. The outlet conduit 161 is coupled to a heater 162. The heaters 119, 158, and 162 are configured to maintain a processing gas flowing through the pipe 118, inlet conduit 157, and the outlet conduit 161 respectively at a temperature above the condensation point of the processing gas. The heaters 119, 158, and 162 are powered by a power source 145.

The gas panel 150 is configured to provide a processing gas including an oxidizer under pressure into the inlet conduit 157 for transmission into the processing region 115 through the pipe 118. The pressure of the processing gas introduced into the processing region 115 is monitored by a pressure sensor 114 coupled to the body 110. The condenser 160 is fluidly coupled to a cooling fluid and configured to condense a gaseous product flowing through the outlet conduit 161 after removal from the processing region 115 through the pipe 118. The condenser 160 converts the gaseous products from the gas phase into liquid phase. A pump 170 is fluidly connected to the condenser 160 and pumps out the liquefied products from the condenser 160. The operation of the gas panel 150, the condenser 160 and the pump 170 are controlled by the controller 180.

The isolation valves 155 and 165 are configured to allow only one fluid to flow through the pipe 118 into the processing region 115 at a time. When the isolation valve 155 is open, the isolation valve 165 is closed such that a processing gas flowing through inlet conduit 157 enters into the processing region 115, preventing the flow of the processing gas into the condenser 160. On the other hand, when the isolation valve 165 is open, the isolation valve 155 is closed such that a gaseous product is removed from the processing region 115 and flows through the outlet conduit 161, preventing the flow of the gaseous product into the gas panel 150.

One or more heaters 140 are disposed on the body 110 and configured to heat the processing region 115 within the pressure vessel 100. In some embodiments, the heaters 140 are disposed on an outer surface 112 of the body 110 as shown in FIG. 1, though in other embodiments, the heaters 140 may be disposed on an inner surface 113 of the body 110. Each of the heaters 140 may be a resistive coil, a lamp, a ceramic heater, a graphite-based carbon fiber composite (CFC) heater, a stainless steel heater, or an aluminum heater, among others. The heaters 140 are powered by the power source 145. Power to the heaters 140 is controlled by a controller 180 through feedback received from a temperature sensor 116. The temperature sensor 116 is coupled to the body 110 and monitors the temperature of the processing region 115.

A cassette 130 coupled to an actuator (not shown) is moved in and out of the processing region 115. The cassette 130 has a top surface 132, a bottom surface 134, and a wall 136. The wall 136 of the cassette 130 has a plurality of substrate storage slots 138. Each substrate storage slot 138 is evenly spaced along the wall 136 of the cassette 130. Each substrate storage slot 138 is configured to hold a substrate 135 therein. The cassette 130 may have as many as fifty substrate storage slots 138 for holding the substrates 135. The cassette 130 provides an effective vehicle both for transferring a plurality of substrates 135 into and out of the pressure vessel 100 and for processing the plurality of substrates 135 in the processing region 115.

The controller 180 controls the operation of the pressure vessel 100. The controller 180 controls the operation of the gas panel 150, the condenser 160, the pump 170, the isolation valves 155 and 165, as well as the power source 145. The controller 180 is also communicatively connected to the temperature sensor 116, the pressure sensor 114, and the cooling channel 124. The controller 180 includes a central processing unit (CPU) 182, a memory 184, and a support circuit 186. The CPU 182 may be any form of a general purpose computer processor that may be used in an industrial setting. The memory 184 may be a random access memory, a read-only memory, a floppy, or a hard disk drive, or other forms of digital storage. The support circuit 186 is conventionally coupled to the CPU 182 and may include cache, clock circuits, input/output systems, power supplies, and the like.

The pressure vessel 100 provides a convenient chamber to perform the method of dry stripping a boron carbide layer from a plurality of substrates 135. The heaters 140 are powered on to pre-heat the pressure vessel 100. At the same time, the heaters 119, 158, and 162 are powered on to pre-heat the pipe 118, the inlet conduit 157, and the outlet conduit 161 respectively.

Figure 2A:
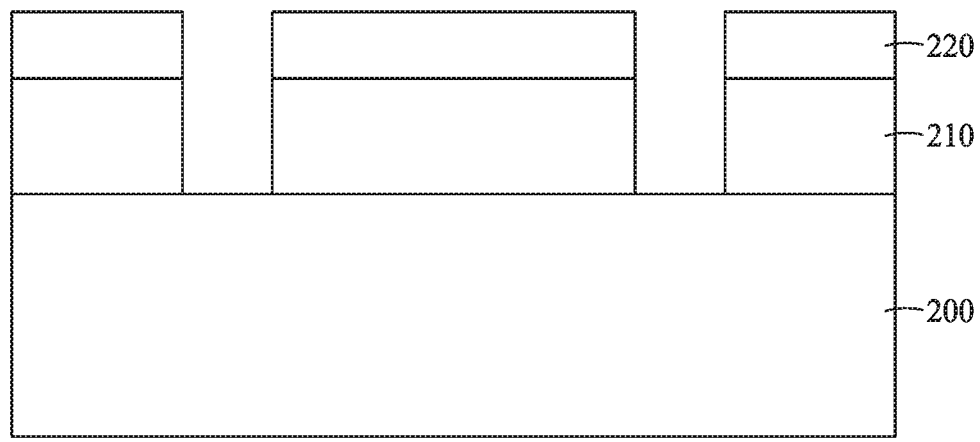
FIG. 2A is a simplified cross-sectional view of a patterned boron carbide layer on an etched layer above a semiconductor substrate.

The plurality of substrates 135 are then loaded on the cassette 130. FIG. 2A shows a simplified cross-sectional view of a patterned boron carbide layer 220 on an etched layer 210 above a semiconductor substrate 200. Each of the substrates 135 are observed as the semiconductor substrate 200 in FIG. 2A when the substrates 135 are loaded on the cassette 130. The door 120 of the pressure vessel 100 is opened to move the cassette 130 into the processing region 115. The door 120 is then sealably closed to enclose the chamber for stripping the boron carbide layers from the top of the substrates 135 on the cassette 130. The seals 122 ensure that there is no leakage of pressure from the processing region 115 once the door 120 is closed.

A processing gas is provided by the gas panel 150 into the processing region 115 inside the pressure vessel 100. The isolation valve 155 is opened by the controller 180 to allow the processing gas to flow through the inlet conduit 157 and the pipe 118 into the processing region 115. The processing gas is introduced at a flow rate of between about 500 sccm and about 2000 sccm for a period of between about 1 minute and about 2 hours. The isolation valve 165 is kept closed at this time. The processing gas is an oxidizer flowed into processing region 115. In some embodiments, the processing gas is steam, which may be dry steam or superheated steam, under a pressure between about 500 Torr and about 60 bar. However, in other embodiments, other oxidizers, such as but not limited to ozone, oxygen, hydrogen peroxide or ammonia may be used. In one embodiment, the processing gas is a mixture including about 5% steam to 100% oxidizer, for example, about 10% oxidizer to about 80% oxidizer. In one example, the processing gas is a mixture of about 5% steam to 100% steam. The isolation valve 155 is closed by the controller 180 when sufficient processing gas has been released by the gas panel 150. The amount of processing gas released by the gas panel 150 is an amount in excess of the amount of the processing gas required to completely react with the boron carbide deposited on the plurality of substrates 135. For example, the amount of steam released by the gas panel 150 may be at least ten times the amount of boron carbide deposited on the substrate.

During processing of the substrates 135, the processing region 115 as well as the inlet conduit 157, the outlet conduit 161, and the pipe 118 are maintained at a temperature and pressure such that the processing gas stays in gaseous phase. Such pressure and temperature is selected based on the composition of the processing gas. The temperatures of the processing region 115 as well as the inlet conduit 157, the outlet conduit 161, and the pipe 118 are maintained at a temperature greater than the condensation point of the processing gas at the applied pressure. For example, when steam under a pressure between 10 bars and 60 bars is used for processing, the temperatures of the processing region 115 as well as the inlet conduit 157, the outlet conduit 161, and the pipe 118 are raised to a temperature of between about 300-700 degrees Celsius. This ensures that the steam does not condense into water, which is harmful for the etched layer 210 and the substrate 200 under the layer 220.

The processing gas is flowed over the substrates 135 such that the boron carbide layers reacts with the processing gas to form gaseous products. For example, boron carbide reacts with steam to produce boron trioxide ($B_2O_3$), hydrogen gas ($H_2$), carbon monoxide (CO), and carbon dioxide ($CO_2$), as shown in reactions (i) and (ii):

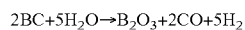  (i)

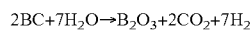  (ii)

Boron trioxide ($B_2O_3$) then reacts with excess steam to produce boric acid ($H_3BO_3$) and metaboric acid ($HBO_2$), as shown in reactions (iii) and (iv):

  (iii)

  (iv)

Boric acid and metaboric acid are volatile products. Boric acid and metaboric acid mix with hydrogen gas, carbon monoxide and carbon dioxide to form a gaseous mixture of products of the reaction between boron carbide and steam.

Figure 2B:
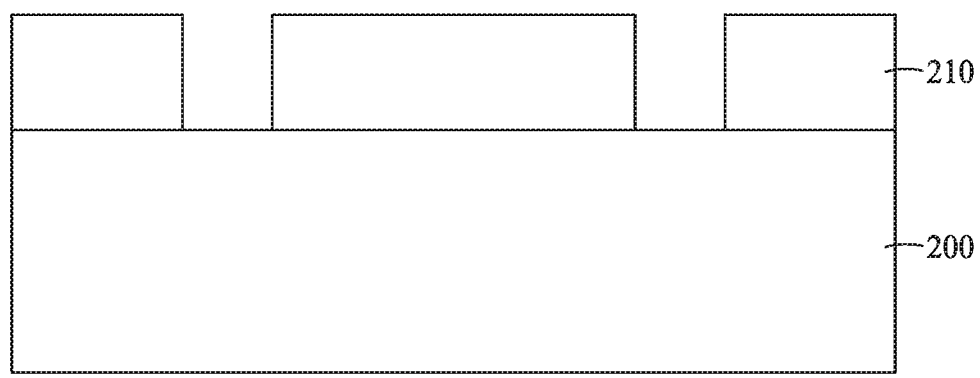
FIG. 2B is a simplified cross-sectional view of the etched layer above the semiconductor substrate after removal of the boron carbide layer.

The processing is complete when the boron carbide layer is observed to have completely stripped from the substrate 135. The isolation valve 165 is then opened to flow the gaseous mixture of products from the processing region 115 through the pipe 118 and outlet conduit 161 into the condenser 160. The gaseous mixture of products is condensed into liquid phase in the condenser 160. The liquefied mixture of products is then removed by the pump 170. When the liquefied mixture of products is completely removed, the isolation valve 165 closes. The heaters 140, 119, 158, and 162 are then powered off. The door 120 of the pressure vessel 100 is then opened to remove the cassette 130 from the processing region 115. FIG. 2B is a simplified cross-sectional view of the etched layer 210 above the semiconductor substrate 200 after removal of the boron carbide layer. Each of the substrates 135 are observed as the semiconductor substrate 200 in FIG. 2B, when the substrates 135 are unloaded from the cassette 130 after removal of the boron carbide layer. The substrates 135 only have the patterned etched layer 210.

Figure 3:
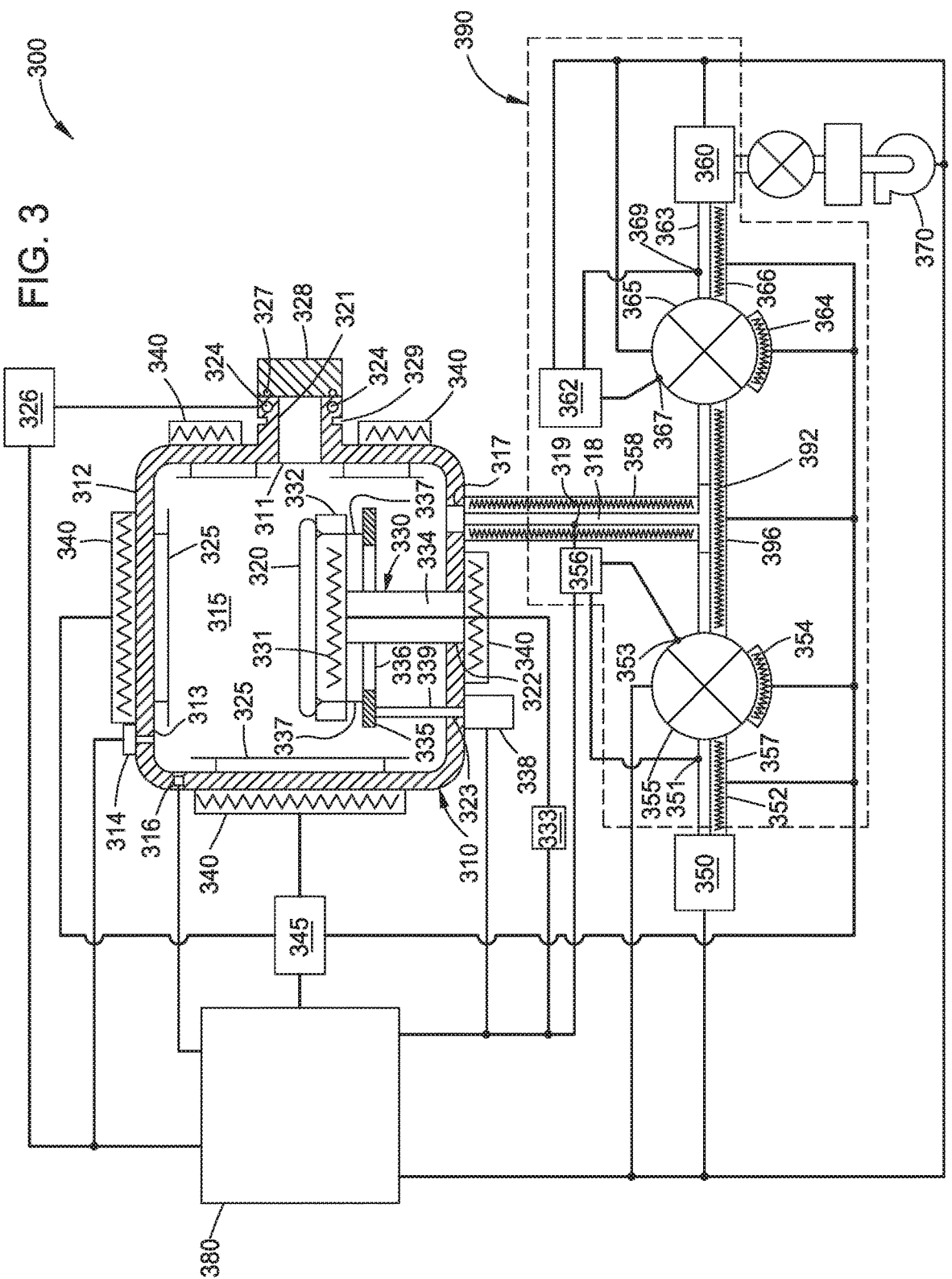
FIG. 3 is a simplified front cross-sectional view of a single substrate processing chamber for dry stripping boron carbide layers.

FIG. 3 is a simplified front cross-sectional view of a single substrate processing chamber 300 for dry stripping boron carbide layers. The single substrate processing chamber 300 has a body 310 with an outer surface 312 and an inner surface 313 that encloses an internal volume 315. In some embodiments such as in FIG. 3, the body 310 has an annular cross section, though in other embodiments the cross-section of the body 310 may be rectangular or any closed shape. The outer surface 312 of the body 310 may be made from a corrosion resistant steel (CRS), such as but not limited to stainless steel. One or more heat shields 325 are disposed on the inner surface 313 of the body 310 that prevent heat loss from the single substrate processing chamber 300 into the outside environment. The inner surface 313 of the body 310 as well as the heat shields 325 may be made from nickel-based steel alloys that exhibit high resistance to corrosion, such as but not limited to HASTELLOY®, INCONEL®, and MONEL®.

A substrate support 330 is disposed within the internal volume 315. The substrate support 330 has a stem 334 and a substrate-supporting member 332 held by the stem 334. The stem 334 passes through a passage 322 formed through the chamber body 310. A rod 339 connected to an actuator 338 passes through a second passage 323 formed through the chamber body 310. The rod 339 is coupled to a plate 335 having an aperture 336 accommodating the stem 334 of the substrate support 330. Lift pins 337 are connected to the substrate-supporting member 332. The actuator 338 actuates the rod 339 such that the plate 335 is moved up or down to connect and disconnect with the lift pins 337. As the lift pins 337 are raised or lowered, the substrate-supporting member 332 is raised or lowered within the internal volume 315 of the single substrate processing chamber 300. The substrate-supporting member 332 has a resistive heating element 331 embedded centrally within. A power source 333 is configured to electrically power the resistive heating element 331.

The operation of the power source 333 as well as the actuator 338 is controlled by a controller 380.

The single substrate processing chamber 300 has an opening 311 on the body 310 through which substrates 320 can be loaded and unloaded to and from the substrate support 330 disposed in the internal volume 315. The opening 311 forms a tunnel 321 on the body 310. A slit valve 328 is configured to sealably close the tunnel 321 such that the opening 311 and the internal volume 315 can only be accessed when the slit valve 328 is open. A seal 327 is utilized to seal the slit valve 328 to the body 310 in order to seal the internal volume 315 for processing. The seal 327 may be made from a polymer, for example a fluoropolymer, such as but not limited to a perfluoroelastomer and polytetrafluoroethylene (PTFE). The seal 327 may further include a spring member for biasing the seal to improve seal performance. A cooling channel 324 is disposed on the tunnel 321 adjacent to the seals 327 in order to maintain the seals 327 below the maximum safe-operating temperature of the seals 327 during processing. A cooling agent from a cooling fluid source 326, such as but not limited to an inert, dielectric, and high-performance heat transfer fluid, may be circulated within the cooling channel 324. The flow of the cooling agent from the cooling fluid source 326 is controlled by the controller 380 through feedback received from a temperature sensor 316 or a flow sensor (not shown). An annular-shaped thermal choke 329 is formed around the tunnel 321 to prevent the flow of heat from the internal volume 315 through the opening 311 when the slit valve 328 is open.

The single substrate processing chamber 300 has a port 317 through the body 310, which is fluidly connected to a fluid circuit 390 connecting the gas panel 350, the condenser 360, and the port 317. The fluid circuit 390 has a gas conduit 392, a source conduit 357, an inlet isolation valve 355, an exhaust conduit 363, and an outlet isolation valve 365. A number of heaters 396, 358, 352, 354, 364, 366 are interfaced with different portions of the fluid circuit 390. A number of temperature sensors 351, 353, 319, 367, and 369 are also placed at different portions of the fluid circuit 390 to take temperature measurements and send the information to the controller 380. The controller 380 uses the temperature measurement information to control the operation of the heaters 352, 354, 358, 396, 364, and 366 such that the temperature of the fluid circuit 390 is maintained at a temperature above the condensation point of the processing fluid disposed in the fluid circuit 390 and the internal volume 315.

The gas panel 350 and the pressure sensor 314 are substantially similar in nature and function as the gas panel 150 and the pressure sensor 114 of FIG. 1. The condenser 360 is substantially similar in nature and function as the condenser 160 of FIG. 1. The pump 370 is substantially similar in nature and function as the pump 170 of FIG. 1. One or more heaters 340 are disposed on the body 310 and configured to heat the internal volume 315 within the single substrate processing chamber 300. The heaters 340 are also substantially similar in nature and function as the heaters 140 used in the batch processing pressure vessel 100.

The controller 380 controls the operation of the single substrate processing chamber 300. The controller 380 controls the operation of the gas panel 350, the condenser 360, the pump 370, the inlet isolation valve 355, the outlet isolation valve 365, and the power sources 333, 345. The controller 380 is also communicatively connected to the temperature sensor 316, the pressure sensor 314, the actuator 338, the cooling fluid source 326, and the temperature reading devices 356 and 362. The controller 380 is substantially similar in nature and function than the controller 180 used in the batch processing pressure vessel 100.

Figure 4:
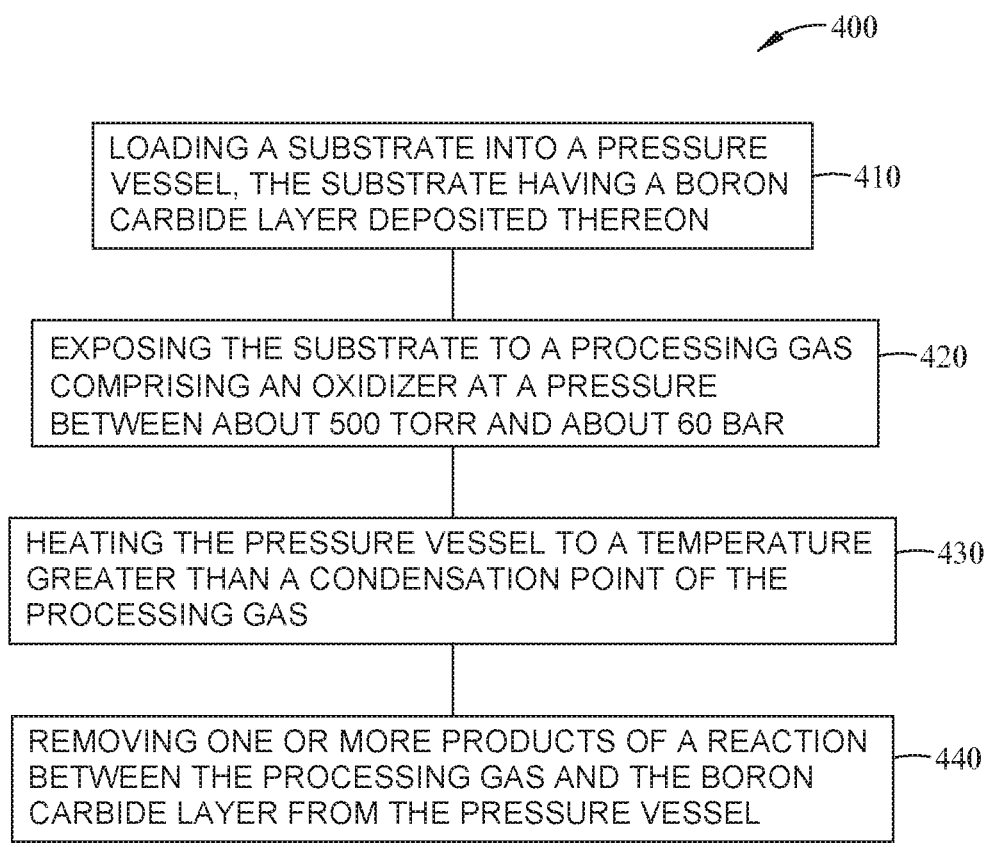
FIG. 4 is a block diagram of a method for dry stripping a boron carbide layer deposited on a semiconductor substrate.

FIG. 4 is a block diagram of a method for dry stripping a boron carbide layer deposited on a semiconductor substrate, according to one embodiment of the present disclosure. The method 400 begins at block 410 by loading a substrate into a pressure vessel. The substrate has a boron carbide layer deposited thereon. In some embodiments, a plurality of substrates may be placed on a cassette and loaded into the pressure vessel. In further embodiments, a single substrate is loaded into the pressure vessel configured to process a single substrate one at a time.

At block 420, the substrate or the plurality of substrates are exposed to a processing gas comprising an oxidizer at a pressure between about 500 Torr and about 60 bar within the pressure vessel. In other embodiments, the substrate or the plurality of substrates are exposed to a processing gas comprising an oxidizer at a pressure greater than about 0 bar, such as between about 1 bar and about 60 bar, within the pressure vessel. In some embodiments, the processing gas is an oxidizer selected from a group consisting of ozone, oxygen, water vapor, heavy water, a peroxide, a hydroxide-containing compound, oxygen isotopes (14, 15, 16, 17, 18, etc.) and hydrogen isotopes (1, 2, 3), or some combination thereof, where the processing gas is a mixture of about 10% oxidizer to about 80% oxidizer. The peroxide may be hydrogen peroxide in gaseous phase. In some embodiments, the oxidizer comprises a hydroxide ion, such as but not limited to water vapor or heavy water in vapor form. In some embodiments, the amount of oxidizer exceeds the amount of oxidizer required to completely react with the amount of boron carbide deposited on the substrate(s). In other embodiments, the processing gas may be steam at a pressure between about 500 Torr and about 60 bar, where steam makes up about 5% of the mixture to 100% of the mixture. The steam may be dry steam or superheated steam. The amount of steam may be at least ten times the amount of boron carbide deposited on the substrate.

At block 430, the pressure vessel is heated to a temperature greater than a condensation point of the processing gas. Raising the temperature enables the boron carbide layer to react with the processing gas. In some embodiments, when steam is used as a processing gas in the pressure vessel, the temperature of the pressure vessel is maintained between about 300 degrees Celsius and about 700 degrees Celsius. In those embodiments, the boron carbide layer reacts with steam to produce a gaseous mixture of products including boron trioxide, carbon dioxide, carbon monoxide, hydrogen, boric acid and metaboric acid.

At block 440, the products of the reaction between the processing gas and the boron carbide layer are removed from the processing chamber. In the embodiments where steam is used, the gaseous mixture of products including boron trioxide, carbon dioxide, carbon monoxide, hydrogen, boric acid, and metaboric acid are pumped out of the pressure vessel. Thus, the boron carbide layer on the substrates is dry stripped, leaving behind desirably etched layers on the semiconductor substrates.

The method for dry stripping a boron carbide layer described herein advantageously enables the dry removal of the boron carbide layer from the semiconductor substrates. A wet-etch solution is not required. Further, when steam under pressure is used, the temperature range of the process between about 300 degrees Celsius and about 700 degrees Celsius ensures that the oxidation rate of boron carbide is low enough to first convert boron carbide to a viscous layer of boron trioxide and yet high enough to convert the viscous layer of boron trioxide into volatile gases like boric acid and metaboric acid that can be subsequently removed. If the temperature of the process is less than 300 degrees Celsius or the pressure of the process is less than 500 Torr, then the balance between initial oxidation of boron carbide to boron trioxide and the subsequent oxidation of boron trioxide to boric acid and metaboric acid is lost, such that the layer is unable to strip completely.

The method described herein improves the throughput of substrates by processing a plurality of substrates for removal of the boron carbide layer at the same time. Further, since boron carbide is not ashable by conventional oxygen plasma capable of removing other layers, the method preserves the viability of boron carbide as a hardmask material. Boron carbide is an excellent choice for hardmask material due to the high etch selectivity, high hardness and high transparency of boron carbide. The method described herein thus helps in the further development of boron carbide layer s to pattern next-generation memory devices, logic devices, microprocessors, etc. Additionally, though the methods described herein are related to boron carbide layers, other types of boron carbide layers can benefit from the disclosure.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A method of stripping a boron carbide layer deposited on a substrate, the method comprising:
   loading the substrate into a processing region of a pressure vessel, the substrate having the boron carbide layer deposited thereon;
   exposing the substrate to a processing gas comprising an oxidizer at a pressure between about 500 Torr and about 60 bar, wherein the processing gas does not comprise a plasma;
   heating the processing region of the pressure vessel to a temperature greater than a condensation point of the processing gas; and
   removing one or more products of a reaction between the processing gas and the boron carbide layer from the pressure vessel.

2. The method of claim 1 wherein exposing the substrate to a processing gas comprises:
   exposing the substrate to steam at a pressure greater than about 10 bar.

3. The method of claim 2, wherein the substrate is exposed to an amount of steam at least ten times an amount of boron carbide deposited on the substrate.

4. The method of claim 1, wherein the oxidizer is selected from a group consisting of ozone, oxygen, water vapor, heavy water, ammonia, a peroxide, a hydroxide-containing compound, oxygen isotopes and hydrogen isotopes.

5. The method of claim 4, wherein the oxidizer is hydrogen peroxide.

6. The method of claim 1, wherein the substrate ape is exposed to an amount of oxidizer in excess of an amount of oxidizer required to completely react with an amount of boron carbide deposited on the substrate.

7. The method of claim 1, wherein the processing region of the pressure vessel is heated to a temperature between about 300 degrees Celsius and about 700 degrees Celsius.

8. The method of claim 1, wherein the processing gas comprises about 5% dry steam to about 100% dry steam.

9. The method of claim 1, wherein the one or more products of the reaction comprise:
   boron trioxide, carbon dioxide, carbon monoxide, hydrogen, boric acid and metaboric acid.

10. A method of stripping a boron carbide layer deposited on a plurality of substrates, the method comprising:
    loading the plurality of substrates simultaneously into a processing region of a pressure vessel, the plurality of substrates each having the boron carbide layer deposited thereon;
    exposing the plurality of substrates to a processing gas comprising an oxidizer at a pressure between about 500 Torr and about 60 bar;
    heating the processing region of the pressure vessel to a temperature greater than a condensation point of the processing gas; and
    removing one or more products of a reaction between the processing gas and the boron carbide layer from the pressure vessel.

11. The method of claim 10, wherein exposing the plurality of substrates to the processing gas comprises:
    exposing the plurality of substrates to steam at a pressure greater than about 10 bar.

12. The method of claim 11, wherein the plurality of substrates are exposed to an amount of steam at least ten times an amount of boron carbide deposited on the plurality of substrates.

13. The method of claim 10, wherein the oxidizer is selected from a group consisting of ozone, oxygen, water vapor, heavy water, ammonia, a peroxide, a hydroxide-containing compound, oxygen isotopes and hydrogen isotopes.

14. The method of claim 13, wherein the oxidizer is hydrogen peroxide.

15. The method of claim 10, wherein the plurality of substrates are exposed to an amount of oxidizer in excess of an amount of oxidizer required to completely react with an amount of boron carbide deposited on the plurality of substrates.

16. The method of claim 10, wherein the processing region of the pressure vessel is heated to a temperature between about 300 degrees Celsius and about 700 degrees Celsius.

17. The method of claim 10, wherein the processing gas comprises about 5% dry steam to about 100% dry steam.

18. The method of claim 10, wherein the one or more products of the reaction comprise:
    boron trioxide, carbon dioxide, carbon monoxide, hydrogen, boric acid and metaboric acid.

19. A method of stripping a boron carbide layer deposited on a plurality of substrates, the method comprising:
    loading the plurality of substrates simultaneously into a processing region of a pressure vessel, the plurality of substrates each having the boron carbide layer deposited thereon;
    exposing the plurality of substrates to a processing gas comprising steam at a pressure between about 10 bar and about 60 bar;
    heating the processing region of the pressure vessel to a temperature greater than a condensation point of the processing gas; and
    removing one or more products of a reaction between the processing gas and the boron carbide layer from the pressure vessel.

20. The method of claim 19, wherein the processing gas comprises about 5% superheated steam to about 100% superheated steam.

\* \* \* \* \*